(12) United States Patent
Matsuda et al.

(10) Patent No.: US 9,246,077 B2
(45) Date of Patent: Jan. 26, 2016

(54) ULTRASONIC TRANSDUCER DEVICE, HEAD UNIT, PROBE, AND ULTRASONIC IMAGING APPARATUS

(71) Applicant: SEIKO EPSON CORPORATION, Tokyo (JP)

(72) Inventors: Hiroshi Matsuda, Gifu (JP); Tsukasa Funasaka, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/192,040

(22) Filed: Feb. 27, 2014

(65) Prior Publication Data

US 2014/0241114 A1 Aug. 28, 2014

(30) Foreign Application Priority Data

Feb. 28, 2013 (JP) .................................. 2013-038460

(51) Int. Cl.
*H01L 41/00* (2013.01)
*H01L 41/047* (2006.01)
(Continued)

(52) U.S. Cl.
CPC .......... *H01L 41/0475* (2013.01); *B06B 1/0622* (2013.01); *G01S 7/56* (2013.01)

(58) Field of Classification Search
CPC ......... H01B 11/00; G01S 7/56; H01L 41/047; H01L 41/0475; B06B 1/0622; B06B 1/06
USPC ....................................................... 367/135
See application file for complete search history.

(56) References Cited

U.S. PATENT DOCUMENTS 4,412,316 A * 10/1983 Diepers ......................... 367/105
6,407,484 B1 * 6/2002 Oliver et al. ................... 310/339
(Continued)

FOREIGN PATENT DOCUMENTS

JP 2004-281651 A 10/2004
JP 2007-510374 A 4/2007
(Continued)

OTHER PUBLICATIONS

Kanda et al.; Influence of Parasitic Capacitance on Output Voltage of Series-Connected PZT Elements; PowerMEMS 2009, Washington DC, USA, Dec. 1-4, 2009; pp. 597-600.

*Primary Examiner* — Luke Ratcliffe
*Assistant Examiner* — Hovhannes Baghdasaryan
(74) *Attorney, Agent, or Firm* — Global IP Counselors, LLP

(57) ABSTRACT

An ultrasonic transducer device includes an ultrasonic transducer element array, a first signal terminal, and a second signal terminal. The ultrasonic transducer element array has a $1^{st}$ element group to a $k^{th}$ element group (where k is a natural number such that k≥2). The first signal terminal is connected with a control section configured and arranged to perform at least one of receiving and transmitting of signals. The second signal terminal is connected with the first signal terminal via the ultrasonic transducer element array. Each of the $1^{st}$ element group to the $k^{th}$ element group includes a plurality of ultrasonic transducer elements electrically connected in series. The $1^{st}$ element group to the $k^{th}$ element group are electrically connected in parallel between the first signal terminal and the second signal terminal.

14 Claims, 10 Drawing Sheets

(51) Int. Cl.
  *G01S 7/56* (2006.01)
  *B06B 1/06* (2006.01)

(56) References Cited

U.S. PATENT DOCUMENTS

| | | |
|---|---|---|
| 7,173,504 B2 | 2/2007 | Larson, III et al. |
| 2004/0130411 A1* | 7/2004 | Beaudin et al. ............... 333/133 |
| 2005/0165314 A1* | 7/2005 | Tanaka ........................... 600/459 |
| 2007/0252748 A1* | 11/2007 | Rees et al. ...................... 342/29 |
| 2007/0290578 A1* | 12/2007 | Horie ............................. 310/344 |
| 2008/0002375 A1* | 1/2008 | Nozaki et al. ................. 361/749 |
| 2008/0027323 A1* | 1/2008 | Freiburger ..................... 600/453 |
| 2008/0172051 A1* | 7/2008 | Masuda et al. ................. 606/37 |
| 2009/0240151 A1* | 9/2009 | Sabata .......................... 600/447 |
| 2009/0318808 A1* | 12/2009 | Brader .......................... 600/443 |
| 2010/0189288 A1* | 7/2010 | Menzel et al. ................. 381/151 |
| 2010/0292632 A1* | 11/2010 | Mulvihill et al. ............... 604/22 |
| 2011/0127881 A1* | 6/2011 | Howarth ........................ 310/319 |
| 2011/0237974 A1* | 9/2011 | Bartol et al. ................... 600/554 |
| 2012/0123263 A1* | 5/2012 | Osaka et al. ................... 600/438 |
| 2012/0188849 A1 | 7/2012 | Matsuda et al. |

FOREIGN PATENT DOCUMENTS

| | | |
|---|---|---|
| JP | 2010-249658 A | 11/2010 |
| JP | 2011-254295 A | 2/2011 |
| JP | 2011-050571 A | 3/2011 |
| JP | 2011-137768 A | 7/2011 |
| JP | 2012-152319 A | 8/2012 |

* cited by examiner

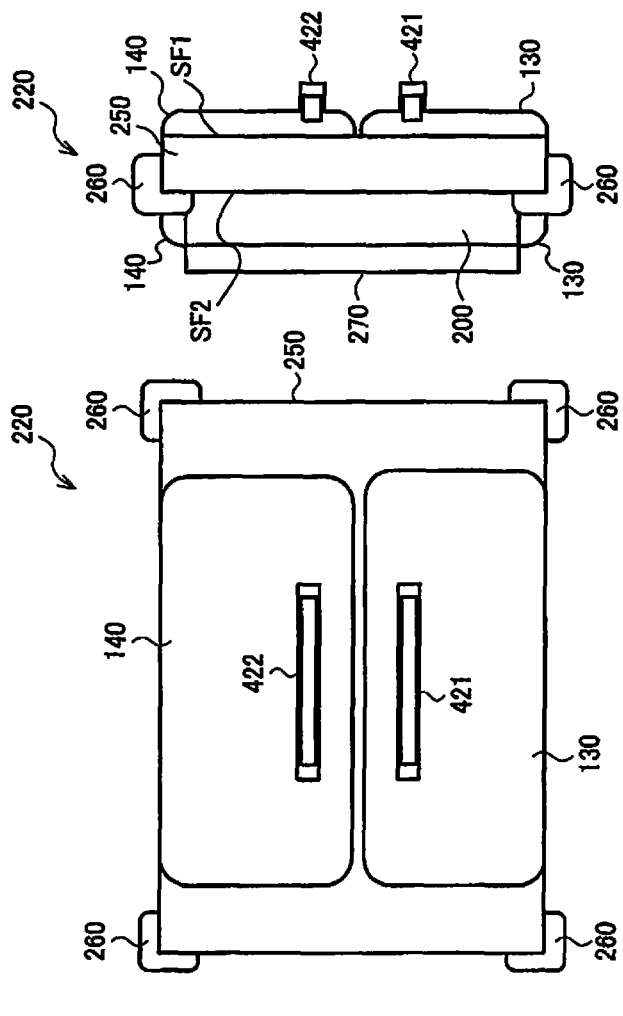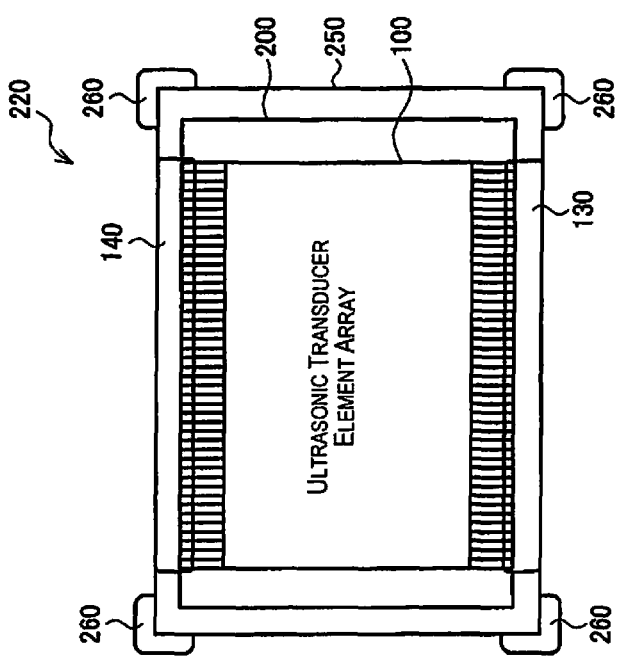

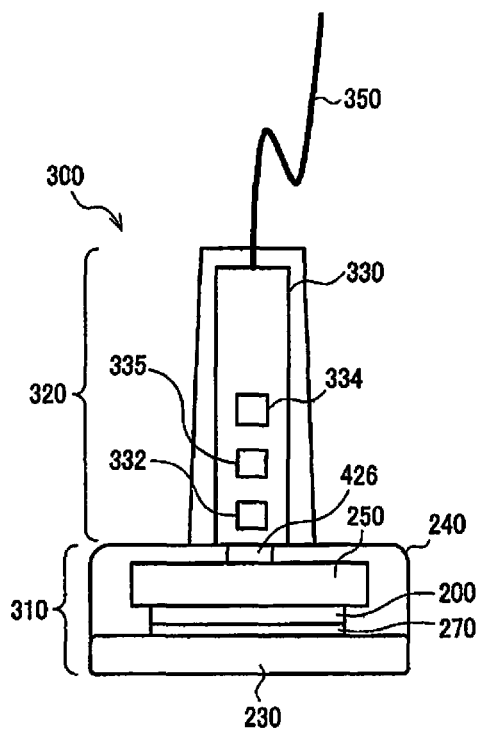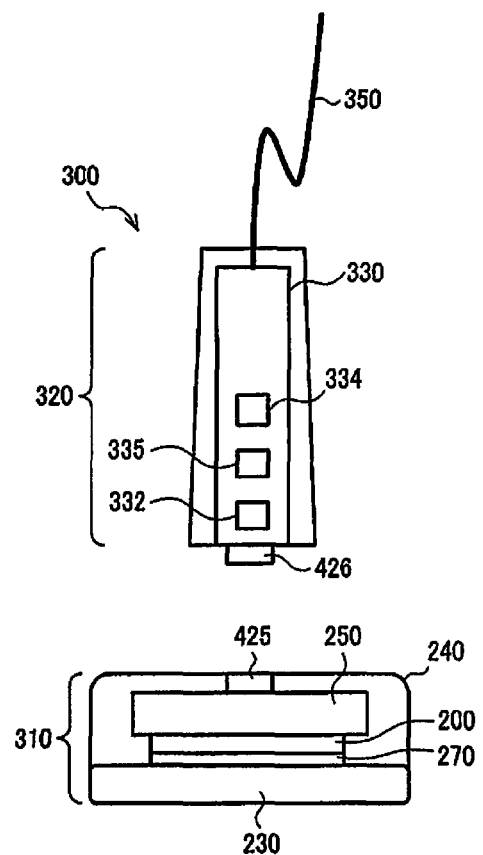
Fig. 9A
Fig. 9B

ULTRASONIC TRANSDUCER DEVICE, HEAD UNIT, PROBE, AND ULTRASONIC IMAGING APPARATUS

CROSS-REFERENCE TO RELATED APPLICATIONS

This application claims priority to Japanese Patent Application No. 2013-038460 filed on Feb. 28, 2013. The entire disclosure of Japanese Patent Application No. 2013-038460 is hereby incorporated herein by reference.

BACKGROUND

1. Technical Field

The present invention relates to an ultrasonic transducer device, a head unit, a probe, an ultrasonic imaging apparatus, and the like.

2. Related Art

An ultrasonic imaging apparatus is known which emits ultrasonic waves from a front end of a probe toward a target object and detects ultrasonic waves which are reflected from the target object (for example, Japanese Unexamined Patent Application Publication No. 2011-50571). For example, the ultrasonic imaging apparatus is used as an ultrasonic diagnosis apparatus which is used in diagnosis by imaging inside the body of a patient or the like. For example, a piezoelectric element is used as an ultrasonic transducer element which transmits and receives ultrasonic waves.

SUMMARY

In an ultrasonic probe in Japanese Unexamined Patent Application Publication No. 2011-50571, sensitivity of transmitting and receiving is improved by switching the connection relationship of the ultrasonic transducer elements when transmitting and receiving between connecting in series or in parallel using a switching circuit by transmitting and receiving of ultrasonic waves which are used in an ultrasonic transducer array where the ultrasonic transducer elements are lined up. However, there is a problem in that the switching circuit for switching and the wiring for this is complex.

According to several aspects of the present invention, it is possible to provide an ultrasonic transducer device, a head unit, a probe, an ultrasonic imaging apparatus, and the like which are able to improve the sensitivity of transmitting and receiving without using a switching switch.

An ultrasonic transducer device according to one aspect includes an ultrasonic transducer element array, a first signal terminal, and a second signal terminal. The ultrasonic transducer element array has a $1^{st}$ element group to a $k^{th}$ element group (where k is a natural number such that k≥2). The first signal terminal is connected with a control section configured and arranged to perform at least one of receiving and transmitting of signals. The second signal terminal is connected with the first signal terminal via the ultrasonic transducer element array. Each of the $1^{st}$ element group to the $k^{th}$ element group includes a plurality of ultrasonic transducer elements electrically connected in series. The $1^{st}$ element group to the $k^{th}$ element group are electrically connected in parallel between the first signal terminal and the second signal terminal.

According to this aspect, the $1^{st}$ element group to the $k^{th}$ element group are connected in parallel between the first signal terminal and the second signal terminal and the plurality of ultrasonic transducer elements which are included in each of the element groups are electrically connected in series in each of the element groups. Due to this, it is possible to improve the sensitivity of transmitting and receiving ultrasonic waves without using a switching switch.

In addition, in another aspect, the first signal terminal is preferably connected with the control section configured to perform receiving and transmitting of signals.

By doing so, it is possible for the control section to perform receiving and transmitting of signals via the first signal terminal and it is possible to perform transmitting and receiving of ultrasonic waves.

In addition, in another aspect, the ultrasonic transducer elements electrically connected in series are preferably arranged to line up along a first direction which is a scanning direction.

By doing this, it is possible to enhance the beam profile in the scanning direction since it is possible to emit ultrasonic waves with the same phase and same amplitude from the plurality of ultrasonic transducer elements which are arranged to line up in the first direction which is the scanning direction.

In addition, in another aspect, the $1^{st}$ element group to the $k^{th}$ element group are preferably arranged to line up along a second direction which intersects with the first direction.

By doing this, it is possible to configure channels using a $1^{st}$ element group to a $k^{th}$ element group which are arranged to line up in a second direction which intersects with the first direction and it is possible to perform a scanning operation by controlling transmitting and receiving of signals by arranging a plurality of the channels.

In addition, in another aspect, each of the $1^{st}$ element group to the $k^{th}$ element group preferably has a $1^{st}$ ultrasonic transducer element to a $j^{th}$ ultrasonic transducer element (where j is a natural number such that j≥2) as the ultrasonic transducer elements. Each of the $1^{st}$ ultrasonic transducer element to the $j^{th}$ ultrasonic transducer element preferably has a first electrode, a second electrode, and a transducer section disposed between the first electrode and the second electrode. The first electrode of the $1^{st}$ ultrasonic transducer element is preferably connected with the first signal terminal. The second electrode of the $1^{st}$ ultrasonic transducer element is preferably connected with the first electrode of a $2^{nd}$ ultrasonic transducer element among the $1^{st}$ ultrasonic transducer element to the $j^{th}$ ultrasonic transducer element.

In addition, in another aspect, the second electrode of a $j-1^{th}$ ultrasonic transducer element among the $1^{st}$ ultrasonic transducer element to the $j^{th}$ ultrasonic transducer element is preferably connected with the first electrode of the $j^{th}$ ultrasonic transducer element, and the second electrode of the $j^{th}$ ultrasonic transducer element is preferably connected with the second signal terminal.

By doing this, it is possible to connect the $1^{st}$ ultrasonic transducer element to the $j^{th}$ ultrasonic transducer element in series between the first signal terminal and the second signal terminal. In addition, there is a possibility that a phase delay will be generated in the transmission signal due to resistance in the wiring which connects the first signal terminal and the first electrode and resistance in the wiring which connects the second signal terminal and the second electrode, but it is possible to suppress the phase delay in the element groups since the plurality of ultrasonic transducer elements are connected in series between the first signal terminal and the second signal terminal according to the aspect of the present invention.

In addition, in another aspect, the ultrasonic transducer device preferably further includes a first signal electrode wiring extending in the second direction which intersects with the first direction and connected with the first signal terminal;

and a second signal electrode wiring extending in the second direction and connected with the second signal terminal. The $1^{st}$ element group to the $k^{th}$ element group are preferably connected in common between the first signal electrode wiring and the second signal electrode wiring.

By doing so, it is possible to connect the plurality of element groups which are arranged in the second direction between the signal electrode wiring and the common electrode wiring which are formed in the second direction which intersects with the first direction. Due to this, it is possible to arrange the layout of the element groups of the channels with high efficiency.

In addition, in another aspect, two channels are preferably arranged to line up along a first direction, which is a scanning direction, with each of the channels including the $1^{st}$ element group to the $k^{th}$ element group arranged to line up along a second direction intersecting with the first direction, the first signal terminal, and the second signal terminal. The control section is preferably configured to perform at least one of receiving and transmitting of signals with respect to the first signal terminal of each of the channels.

By doing so, at least two of the channels are configured to include the $1^{st}$ element group to the $k^{th}$ element group and the first signal terminal and the second signal terminal are arranged. Due to this, it is possible to reduce wiring resistance in the electrode wiring compared to a case where a plurality of channels are connected with one second signal terminal which is shared, and it is possible to suppress delay or the like in the transmission signal due to the wiring resistance in the electrode wiring. In addition, by allocating the second signal terminal for each of the channels, it is possible to suppress crosstalk between the channels via the second signal terminal and the second electrode wiring which is connected with the second signal terminal.

In addition, an ultrasonic transducer device according to another aspect includes an ultrasonic transducer element array, a first signal terminal and a second signal terminal. The first signal terminal is connected with a control section configured to perform at least one of receiving and transmitting of signals. The second signal terminal is connected with the first signal terminal via the ultrasonic transducer element array. The ultrasonic transducer element array has at least one element group including a plurality of ultrasonic transducer elements electrically connected in series and arranged to line up along a first direction which is a scanning direction.

In addition, an ultrasonic transducer device according to another aspect includes a first element group, a second element group and a connecting wiring. The first element group includes a plurality of ultrasonic transducer elements electrically connected in series. The second element group includes a plurality of ultrasonic transducer elements electrically connected in series. The connecting wiring electrically connects the first element group and the second element group in parallel.

In addition, a head unit of a probe includes the ultrasonic transducer device according to any one of the above described aspects. The ultrasonic transducer device is configured and arranged to be attached and detached with respect to a probe body of the probe.

In addition, in another aspect, the head unit preferably further includes a first flexible substrate having a wiring group disposed at one end of the ultrasonic transducer device and connected with one of the first signal terminal and the second signal terminal arranged at the one end of the ultrasonic transducer device.

In addition, in another aspect, the head unit preferably further includes a second flexible substrate having a wiring group disposed at the other end of the ultrasonic transducer device and connected with the other one of the first signal terminal and the second signal terminal arranged at the other end of the ultrasonic transducer device.

By doing this, it is possible to supply the transmission signal from one end and the other end of the ultrasonic transducer device via the first flexible substrate and the second flexible substrate. Due to this, it is possible to suppress deviation of the beam profile in the slice direction compared to a case where the transmission signal is supplied only from one end of the ultrasonic transducer device.

In addition, a probe according to another aspect includes: the ultrasonic transducer device according to any one of the above described aspects; and a probe body.

In addition, an ultrasonic imaging apparatus according to another aspect includes: the probe according to any one of the above described aspects; and a display section configured and arranged to display image data.

BRIEF DESCRIPTION OF THE DRAWINGS

Referring now to the attached drawings which form a part of this original disclosure:

FIGS. 8A to 8C are detailed configuration examples of the head unit.

FIGS. 9A and 9B are configuration examples of an ultrasonic probe.

DETAILED DESCRIPTION OF EXEMPLARY EMBODIMENTS

The following describes a preferred embodiment of the present invention in detail. Here, the present embodiment described below is not gratuitously limited by the content of the present invention described in the scope of the claims and the entire configuration described in the present embodiment is not necessarily essential as a means to solve the problems in the present invention.

1. Ultrasonic Transducer Element

Figure 1A:
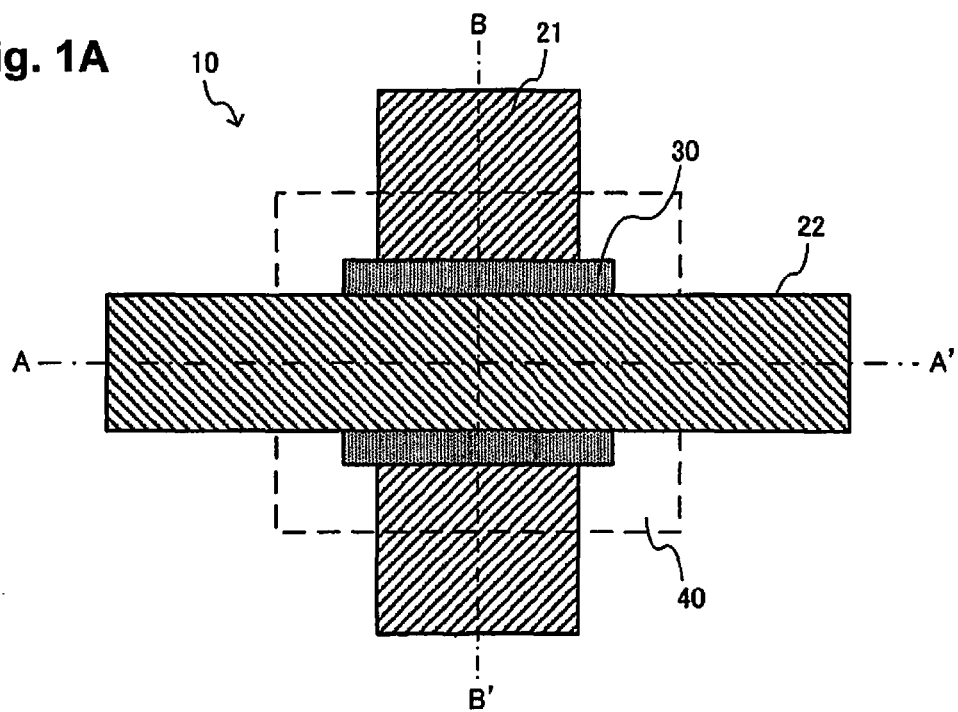
FIGS. 1A to 1C are configuration examples of an ultrasonic transducer element.
Figure 1B:
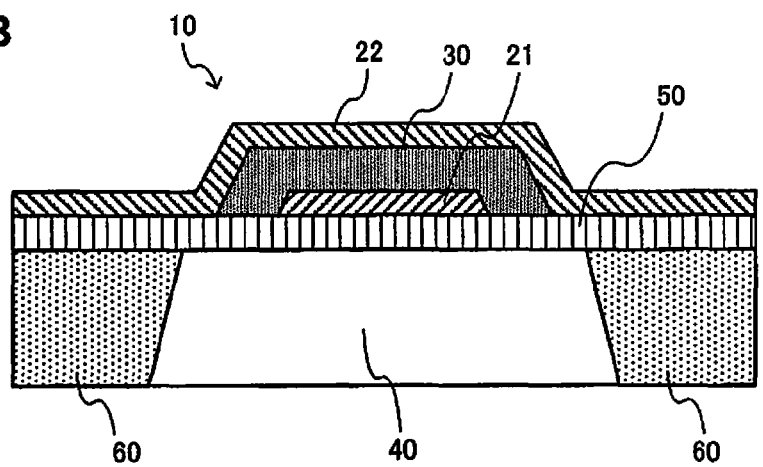
Figure 1C:
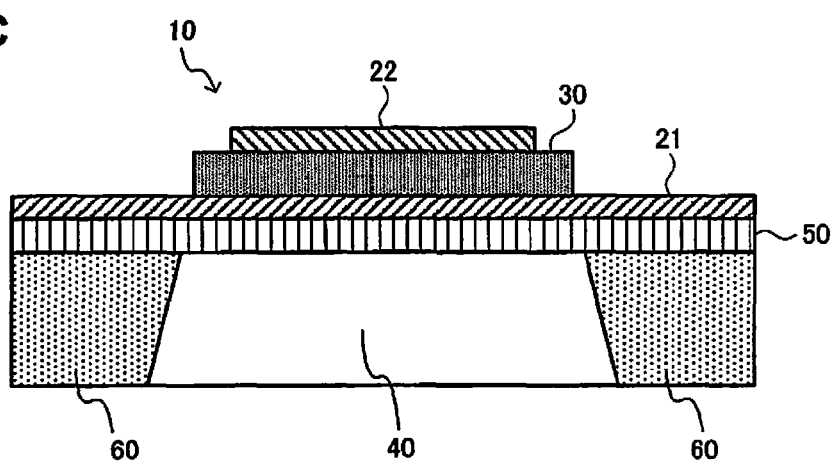

FIGS. 1A to 1C illustrate a configuration example of an ultrasonic transducer element 10 which is applied to an ultrasonic transducer device of the present embodiment. The ultrasonic transducer element 10 includes a vibrating film 50 (a membrane and a support member), a first electrode layer 21 (a lower electrode layer), a piezoelectric body layer 30 (a piezoelectric body film), and a second electrode layer 22 (an upper electrode layer).

The ultrasonic transducer element 10 is formed on a substrate 60. The substrate 60 is, for example, a silicon substrate. FIG. 1A is a planar diagram of the ultrasonic transducer element 10 viewed from a direction which is orthogonal to the substrate 60 on an element forming surface side. FIG. 1B is a cross sectional diagram illustrating a cross section along AA' in FIG. 1A. FIG. 1C is a cross sectional diagram illustrating a cross section along BB' in FIG. 1A.

The first electrode layer 21 is formed by, for example, a metal thin film on an upper layer of the vibrating film 50. The first electrode layer 21 may be wiring which extends to an outer side of an element forming region as shown in FIG. 1A and is connected with the adjacent ultrasonic transducer element 10.

The piezoelectric body layer 30 is formed using, for example, a PZT (lead zirconate titanate) thin film and is provided so as to cover at least a portion of the first electrode layer 21. Here, the material of the piezoelectric body layer 30 is not limited to PZT, and for example, lead titanate ($PbTiO_3$), lead zirconate ($PbZrO_3$), lanthanum-modified lead titanate ($(Pb, La)TiO_3$), and the like may be used.

The second electrode layer 22 is formed using, for example, a thin metal film and is provided so as to cover at least a portion of the piezoelectric body layer 30. The second electrode layer 22 may be wiring which extends to an outer side of the element forming region as shown in FIG. 1A and is connected with the adjacent ultrasonic transducer element 10.

One out of a portion which is covered by the piezoelectric body layer 30 out of the first electrode layer 21 and a portion which covers the piezoelectric body layer 30 out of the second electrode layer 22 forms the first electrode and the other portions of the first electrode layer 21 and the other forms the second electrode. The piezoelectric body layer 30 is provided to interpose the first electrode and the second electrode. The first electrode, the second electrode, and the piezoelectric body layer 30 are referred to as the piezoelectric element section.

The vibrating film 50 is provided so as to block off an opening 40 using a two layer structure of, for example, an $SiO_2$ thin film and a $ZrO_2$ thin film. It is possible for the vibrating film 50 to support the piezoelectric body layer 30, the first electrode layer 21, and the second electrode layer 22, to vibrate according to expansions and contractions of the piezoelectric body layer 30, and to generate ultrasonic waves.

The opening 40 (a hollow region) is formed by etching using reactive ion etching (RIE) or the like from the rear surface (the surface where elements are not formed) side of the substrate 60. The resonance frequency of the ultrasonic waves is determined by the size of the vibrating film 50 which is able to vibrate according to the forming of the opening 40 and the ultrasonic waves are radiated to the piezoelectric body layer 30 side (in a forward direction from behind the surface of the diagram in FIG. 1A).

The piezoelectric body layer 30 expands and contracts in an in-plane direction due to a voltage being applied between the first electrode and the second electrode, that is, between the first electrode layer 21 and the second electrode layer 22. The ultrasonic transducer element 10 uses a monomorphic (unimorphic) structure where a thin piezoelectric element (the piezoelectric body layer 30) and a metal plate (the vibrating film 50) are bonded, and warping is generated in order to maintain the dimensions of the vibrating film 50 which is bonded to the piezoelectric body layer 30 when the piezoelectric body layer 30 expands and contracts in the plane. The vibrating film 50 vibrates with respect to a film thickness direction due to an alternating current being applied to the piezoelectric body layer 30, and ultrasonic waves are radiated due to the vibration of the vibrating film 50. The voltage which is applied to the piezoelectric body layer 30 is, for example, 10 to 30 V and the frequency is, for example, 1 to 10 MHz.

It is possible to narrow the element pitch since it is possible to reduce the size of the elements compared to the bulk ultrasonic transducer elements due to the ultrasonic transducer elements 10 being configured as described above. Due to this, it is possible to suppress the generation of grating lobes. In addition, it is possible to configure a driving circuit using a circuit element with low resistance to voltage since driving is possible using voltage amplitude which is small compared to bulk ultrasonic transducer elements.

2. Ultrasonic Transducer Device

Figure 2:
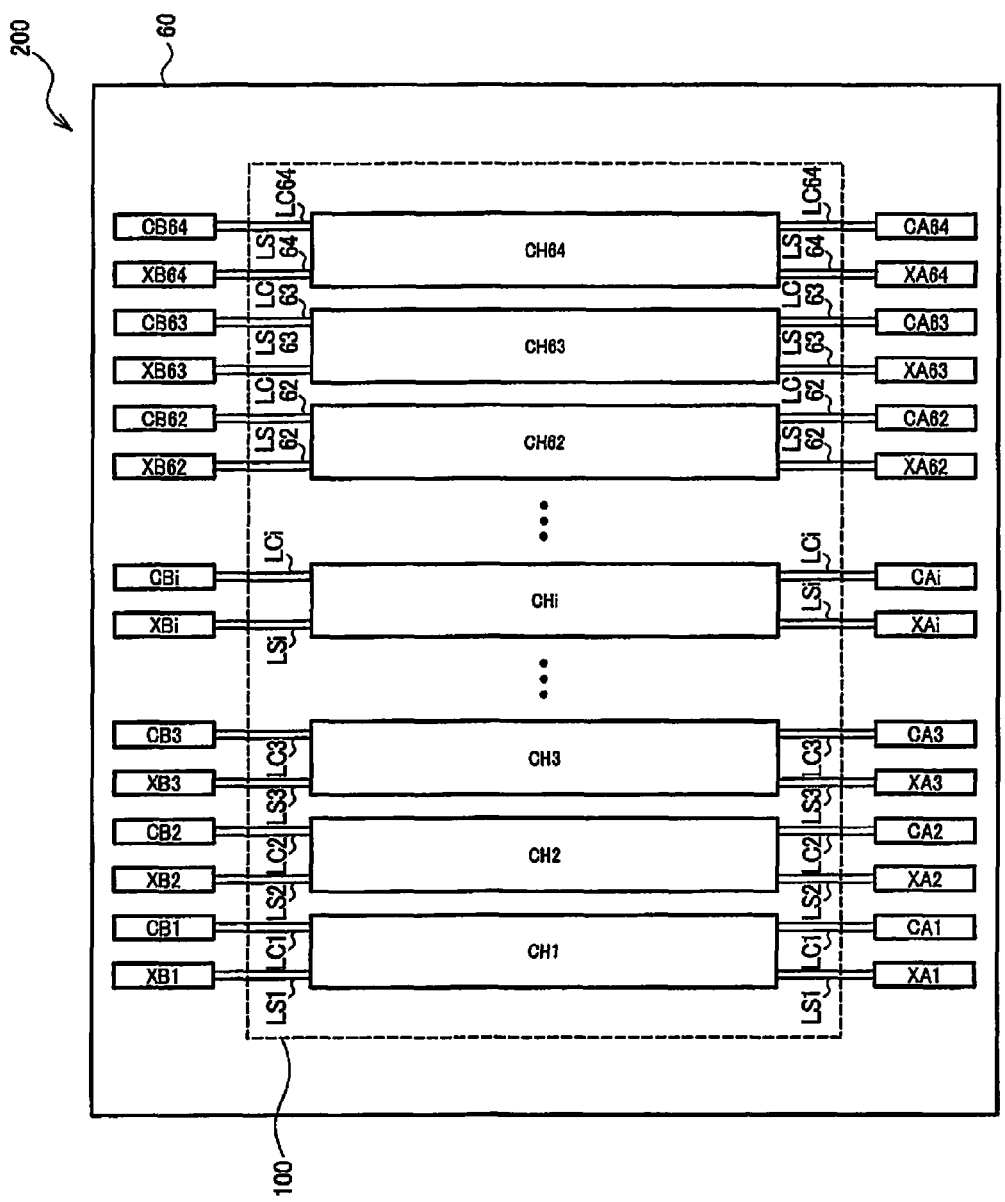
FIG. 2 is a configuration example of an ultrasonic transducer device.

FIG. 2 illustrates a configuration example of an ultrasonic transducer device 200 of the present embodiment. It is possible to adopt a transducer which is a type which uses a piezoelectric element as described above (a thin film piezoelectric element) as the ultrasonic transducer device 200, but the present embodiment is not limited to this. For example, a transducer which is a type which uses a capacitive element such as a c-MUT (Capacitive Micro-machined Ultrasonic Transducer) may be adopted.

Here, below, a case where the transmitting and receiving channels are configured as $1^{st}$ to $64^{th}$ channels will be described as an example, but the present embodiment is not limited to this and the transmitting and receiving channels may be configured as $1^{st}$ to $n^{th}$ channels where n does not equal 64. In addition, below, a case where the terminals are connected with both ends of the signal electrode wirings and the common electrode wirings will be described as an example, but the present embodiment is not limited to this and the terminals may be connected with only one end of the signal electrode wirings and the common electrode wirings. In addition, below, a case where the element groups are connected between the signal terminals and the common terminal will be described as an example, but the present embodiment is not limited to this. That is, the element groups may be connected between two signal terminals and, for example, an opposite phase signal may be supplied to the two signal terminals.

The ultrasonic transducer device 200 includes the substrate 60, an ultrasonic transducer element array 100 which is formed on the substrate 60, signal terminals XA1 to XA64 and signal terminals XB1 to XB64 which are formed on the substrate 60, common terminals CA1 to CA64 (signal terminals in a broad meaning) and signal terminals CB1 to CB64 (signal terminals in a broad meaning) which are formed on the substrate 60, signal electrode wirings LS1 to LS64 which are formed on the substrate 60, and common electrode wirings LC1 to LC64 (signal electrode wirings in a broad meaning) which are formed on the substrate 60.

The signal terminals XA1 to XA64 and the common terminals CA1 to CA64 are arranged at one end section of the ultrasonic transducer element array 100 in a slice direction DL and the signal terminals XB1 to XB64 and the common terminals CB1 to CB64 are arranged at the other end section of the ultrasonic transducer element array 100. For example, the substrate 60 has a rectangular shape with a scanning direction DS as the long side direction, the signal terminals XA1 to XA64 and the common terminals CA1 to CA64 are alternately arranged along one long side of the rectangular shape, and the signal terminals XB1 to XB64 and the common terminals CB1 to CB64 are alternately arranged along the other long side of the rectangular shape.

Here, the scanning direction DS and the slice direction DL represent directions on the plane of the substrate 60. The scanning direction DS corresponds to, for example, the direction where an ultrasonic beam scans in scanning operations such as sector scanning or linear scanning. The slice direction DL is a direction which intersects with (for example, is orthogonal to) the scanning direction DS and, for example, in a case where a tomographic image is obtained by scanning an ultrasonic beam, corresponds to the direction which is orthogonal to the tomography.

The signal electrode wirings LS1 to LS64 and the common electrode wirings LC1 to LC64 are alternately arranged along the scanning direction DS. Each of the signal electrode wirings LSi and each of the common electrode wirings LCi are arranged along the slice direction DL (i is a natural number such that i=64 or less). The signal terminal XAi is connected with one end of the signal electrode wiring LSi and the signal terminal XBi is connected with the other end of the signal electrode wiring LSi. The common terminal CAi is connected with one end of the common electrode wiring LCi and the common terminal CBi is connected with the other end of the common electrode wiring LCi.

The ultrasonic transducer element array 100 includes channel element groups CH1 to CH64 which are arranged along the scanning direction DS. Each channel element group CHi is configured by a plurality of ultrasonic transducer elements 10 which are electrically connected and is connected with the signal electrode wirings LSi and the common electrode wirings LCi. A detailed configuration of the channel element groups CHi will be described later.

One transmitting and receiving channel is configured by the signal terminals XAi and XBi, the signal electrode wiring LSi, the channel element group CHi, the common electrode wiring LCi, and the common terminals CAi and CBi. That is, when a transmission signal (for example, a voltage pulse with the same phase and the same amplitude) is supplied to the signal terminals XAi and XBi, the transmission signal is converted into ultrasonic waves by the ultrasonic transducer element 10 of the channel element group CHi and emitted as ultrasonic waves. Then, an ultrasonic echo which is reflected by the target object is converted into a reception signal (for example, a voltage signal) by the ultrasonic transducer element 10 and the reception signal is output from the signal terminals XAi and XBi. Here, a common voltage (for example, a constant voltage) is supplied to the common terminals CAi and CBi.

3. Channel Element Groups

Here, in order to detect the ultrasonic echo with high sensitivity, it is necessary to perform at least one of increasing transmission sound pressure and improving reception sensitivity.

As a method for increasing the transmission sound pressure, connecting a plurality of the ultrasonic transducer elements 10 in parallel between the signal terminal XAi (and XBi) and the common terminal CAi (and CBi) may be considered. In the case of connecting in parallel, since the transmission voltage between the terminals XAi and CAi is applied to the plurality of ultrasonic transducer elements 10, it is possible to increase the transmission sound pressure compared to the case where there is one of the ultrasonic transducer elements 10.

However, in the case of connecting in parallel, since there is output to the terminal XAi without increasing the amplitude of the reception voltage of each of the ultrasonic transducer elements 10, it is not possible to expect an improvement in reception sensitivity. For example, it is necessary to receive weak echoes in order to observe the depth of a body and it is necessary to increase S/N during reception. In addition, since there is an upper limit to the transmission sound pressure in consideration of the effects or the like on the human body, it is necessary to increase reception sensitivity.

As a method for improving reception sensitivity, connecting the plurality of ultrasonic transducer elements 10 in series between the signal terminal XAi (and XBi) and the common terminal CAi (and CBi) may be considered. In the case of connecting in series, since there is output to the terminal XAi by increasing the reception voltage between the terminals of each of the ultrasonic transducer elements 10, it is possible to improve reception sensitivity.

However, since the transmission voltage is subject to voltage division and applied to the plurality of ultrasonic transducer elements 10 by being voltage-divided, it is not possible to expect an improvement in transmission sound pressure. In this manner, there is a problem in that it is difficult to improve the sensitivity of transmitting and receiving as a whole by increasing both transmission sound pressure and reception sensitivity.

Figure 3:
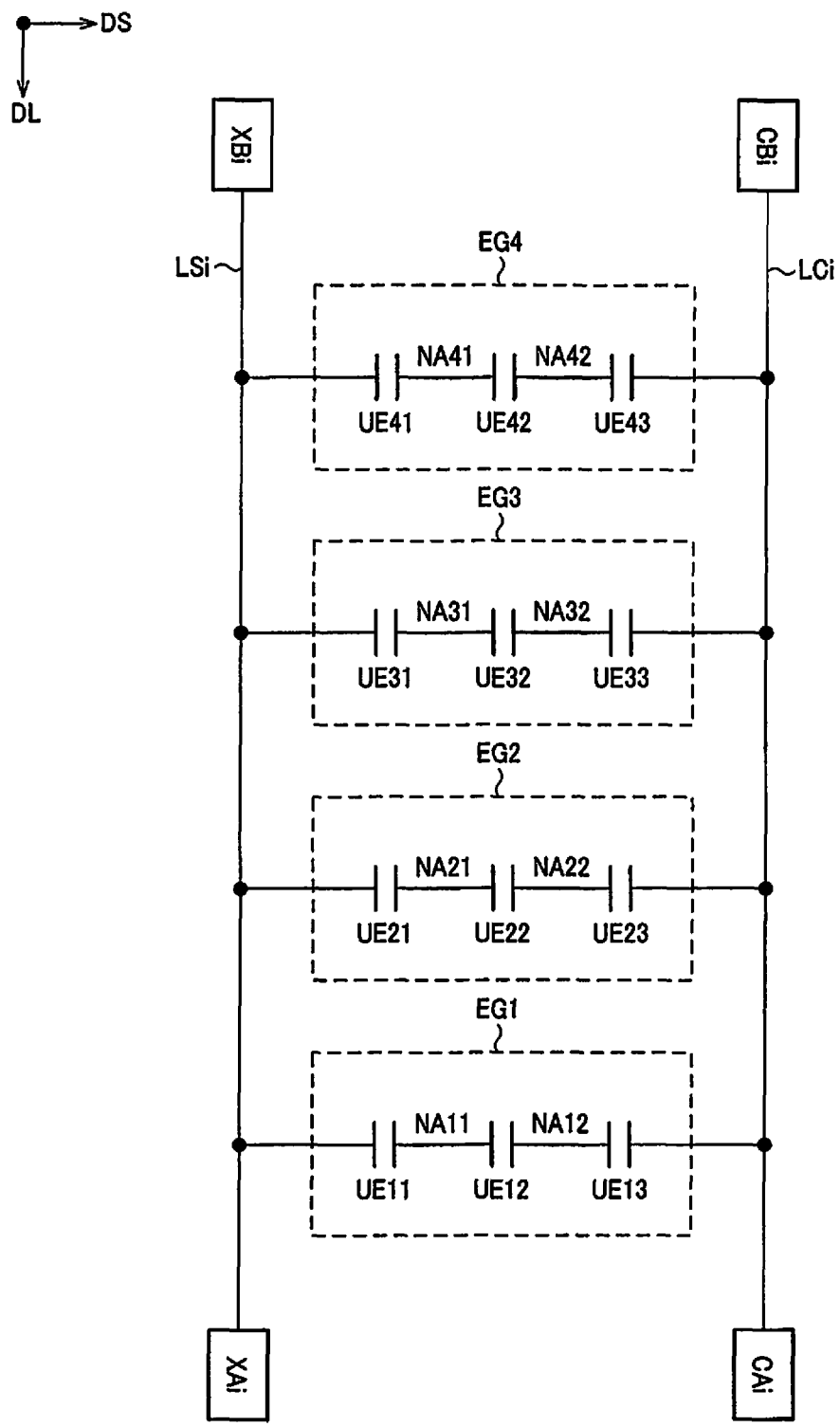
FIG. 3 is a configuration example of a channel element group.

FIG. 3 illustrates a configuration example of the channel element group CHi of the present embodiment which is able to solve the problem described above. The channel element group CHi includes element groups EG1 to EGk (k is a natural number such that k≥2) which are connected in parallel between the signal electrode wirings LSi and the common electrode wirings LCi. Here, below, a case where k=4 will be described as an example, but the present embodiment is not limited to this.

Each of the element groups of the element groups EG1 to EG4 has j ultrasonic transducer elements 10 (j is a natural number such that j≥2) which are connected in series. Here, below, a case where j=3 will be described as an example, but the present embodiment is not limited to this. In detail, an element group EGt (t is a natural number such that t≥4=k) has an ultrasonic transducer element UEt1 which is provided between the signal electrode wiring LSi and a node NAt1, an ultrasonic transducer element UEt2 which is provided between the node NAt1 and a node NAt2, and an ultrasonic transducer element UEt3 which is provided between the node NAt2 and the common electrode wiring LCi.

The ultrasonic transducer elements UEt1 to UEt3 of each of the element groups EGt are arranged along the scanning direction DS and the element groups EG1 to EG4 are arranged along the slice direction DL. In detail, the $s^{th}$ ultrasonic transducer elements UE1s, UE2s, UE3s, and UE4s (s is a natural number such that s≤3=j) of the element groups EG1 to EG4 are arranged along the slice direction DL.

Here, in the present embodiment, the ultrasonic transducer elements UE1s, UE2s, UE3s, and UE4s are not limited to a case of being lined up in a straight line along the slice direction DL, and for example, the ultrasonic transducer elements UE1s, UE2s, UE3s, and UE4s may be lined up to be alternately shifted with respect to a straight line (for example, UE1s, and UE3s may be shifted to the right of the paper surface of the diagram and UE2s and UE4s may be shifted to the left of the paper surface of the diagram). In addition, the number of ultrasonic transducer elements in each of the element groups is not limited to the same number as j and the number of ultrasonic transducer elements may be different for each of the element groups.

4. Layout Configuration

Figure 4:
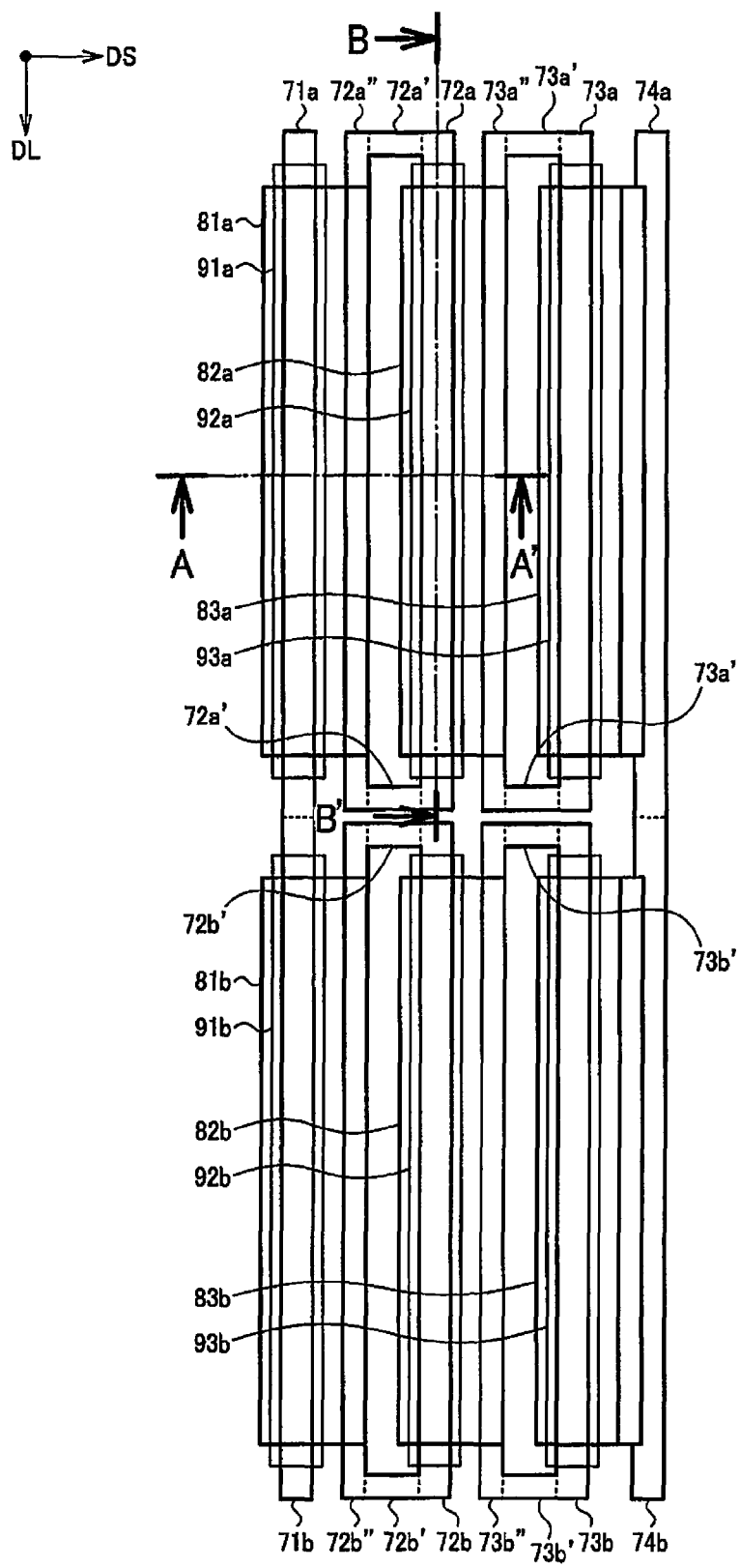
FIG. 4 is a planar diagram of a layout configuration example of a channel element group.
Figure 5A:
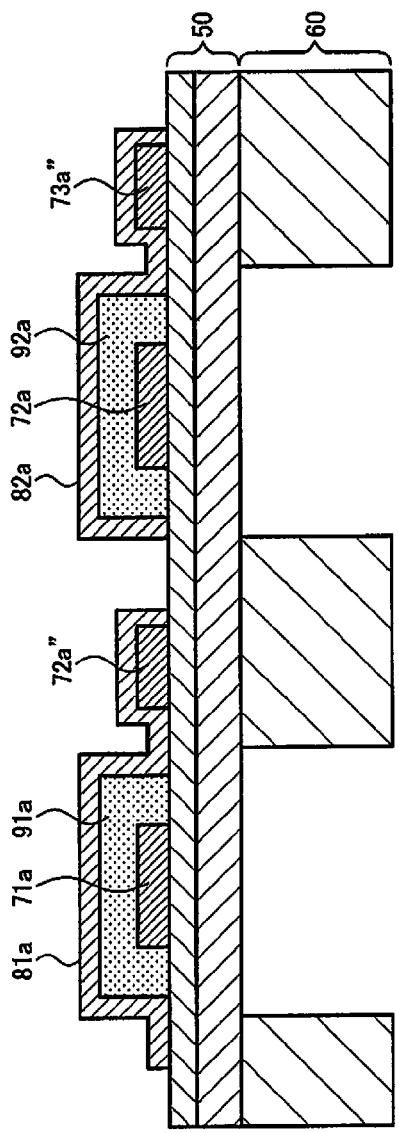
FIGS. 5A and 5B are cross sectional diagrams of the layout configuration example of the channel element group.
Figure 5B:
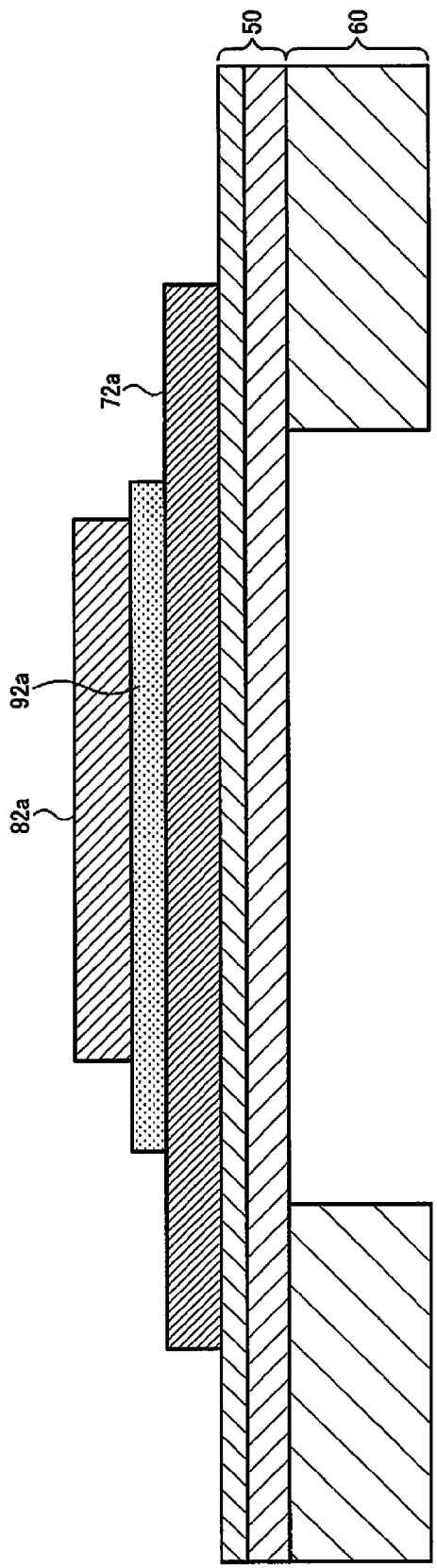

FIG. 4 to FIG. 5B illustrate a layout configuration of the channel element group CHi described above. FIG. 4 is a planar diagram viewed in the thickness direction of the substrate 60 from the ultrasound emission direction side. FIG. 5A is a cross sectional diagram of the cross section AA' in FIG. 4 and FIG. 5B is a cross sectional diagram of the cross section BB' in FIG. 4. Here, for simplicity, below, only the two element groups of the element groups EG1 and EG2 will be described, but the same applies to the element groups EG3 and EG4.

Firstly, the layout configuration of each of the element groups will be described with the element group EG2 as an example. The element group EG2 is configured by first electrode layers 71a, 72a to 72a", 73a to 73a", and 74a, second electrode layers 81a to 83a, and piezoelectric body layers 91a to 93a. The constituent components are arranged above the vibrating film 50 as shown in FIG. 5A and FIG. 5B. Here, "above" refers to a direction which is separated from the substrate 60 in the ultrasound emission direction in the thickness direction of the substrate 60.

As shown in FIG. 4, in a plan view, the first electrode layers 71a to 73a with a rectangular shape are arranged along the scanning direction DS and the long sides of the rectangular shapes are arranged so as to be along the slice direction DL. The piezoelectric body layers 91a to 93a are arranged so as to cover above the first electrode layers 71a to 73a at equal intervals along the scanning direction DS. The piezoelectric body layers 91a to 93a are a rectangular shape in a plan view and the long side of the rectangular shape is arranged so as to be along the slice direction DL. The second electrode layers 81a to 83a are arranged so as to cover above the piezoelectric body layers 91a to 93a at equal intervals along the scanning direction DS and are insulated from the first electrode layers 71a to 73a by the piezoelectric body layers 91a to 93a.

The piezoelectric body layers 91a to 93a and the electrode layers which are above and below the piezoelectric body layers 91a to 93a correspond to the ultrasonic transducer elements UE21 to UE23 of the element group EG2. The first electrode layer 71a of the element UE21 corresponds to the signal electrode wiring LSi. In addition, the second electrode layer 81a of the element UE21 is arranged above the first electrode layer 72a" which is arranged such that the long side of the rectangular shape is along the slice direction DL, and the first electrode layer 72a" is connected with the first electrode layer 72a of the element UE22 by the first electrode layer 72a'. That is, the second electrode layer 81a of the element UE21 and the first electrode layer 72a of the element UE22 are conductive. In the same manner, the second electrode layer 82a of the element UE22 and the first electrode layer 73a of the element UE23 are conductive. The second electrode layer 83a of the element UE23 is arranged above the first electrode wiring 74a such that the longitudinal direction is arranged along the slice direction DL. The first electrode wiring 74a corresponds to the common electrode wiring LCi. In this manner, the elements UE21 to UE23 are configured to be connected in series between the signal electrode wiring LSi and the common electrode wiring LCi.

Here, the first electrode layers 71a and 71b, the first electrode layers 72a to 72a", the first electrode layers 73a to 73a", the first electrode layers 72b to 72b", and the first electrode layers 73b to 73b" are divided for convenience (shown by dotted lines in FIG. 4) and are each configured by one electrode layer (shown by a solid line). Also, as illustrated in FIG. 4, the first electrode layers 72a to 72a", the first electrode layers 73a to 73a", the first electrode layers 72b to 72b", and the first electrode layers 73b to 73b" are each formed in a looped shape.

The piezoelectric body layers 91a to 93a which are connected in series have the same area in the portions which are interposed by the electrode layers. In this case, the voltage which is applied between the electrodes which interpose the piezoelectric body layers 91a to 93a is equal, and the phase and the sound pressure of the ultrasonic waves which are emitted are also the same. As a result, since ultrasonic waves with the same phase and the same sound pressure are emitted from the elements which are arranged at equal intervals in the scanning direction DS, it is possible to improve the beam profile in the scanning direction.

To describe in more detail, for example, the elements UE11 to UE13 of the element group EG1 can be assumed to be connected in parallel between the signal terminal XAi and the common terminal CAi. In this case, there is a possibility that the phase and the amplitude of the transmission signals will be different in each of the elements due to differences or the like in the wiring lengths (that is, wiring resistances) up to each of the elements. In this case, regardless of being elements of the same channel, ultrasonic waves are emitted with different phases and sound pressures. In this point, it is possible to emit ultrasonic waves with the same phase and the same sound pressure due to the connecting in series in the present embodiment.

Next, the layout configuration of the element groups EG1 to EG4 will be described. The first electrode layers (71b of EG1 and 71a of EG2 in FIG. 4) of the elements UE11 to UE41 of the element groups EG1 to EG4 are a single conductive electrode layer or electrode layers which are electrically connected and correspond to the signal electrode wiring LSi. In addition, the first electrode layers (74b and 74a in FIG. 4) where the second electrode layers of the elements UE13 to UE43 of the element groups EG1 to EG4 are connected are a single conductive electrode layer or electrode layers which are electrically connected and correspond to the common electrode wiring LCi. That is, the element groups EG1 to EG4 are configured to be connected in parallel between the signal electrode wiring LSi and the common electrode wiring LCi.

The piezoelectric body layers (91b and 91a in FIG. 4) of the elements UE11 to UE41 of the element groups EG1 to EG4 are arranged at equal intervals along the slice direction DL. In the same manner, the piezoelectric body layers (92b and 92a in FIG. 4) of the elements UE12 to UE42 and the piezoelectric body layers (93b and 93a in FIG. 4) of the elements UE13 to UE43 are arranged at equal intervals along the slice direction DL. That is, 3×4 piezoelectric body layers are arranged at equal intervals in the scanning direction DS and the slice direction DL and one of the channels is configured by the 3×4 ultrasonic transducer elements of the piezoelectric body layers.

Here, in the above description, an arrangement where the piezoelectric body layers (91a to 93a and the like) have a rectangular shape in a plan view and the long side of the rectangular shape is arranged along the slice direction DL is described as an example, but the present embodiment is not limited to this, and for example, the piezoelectric body layers may be a square shape (substantially square shape) or the like.

According to the embodiment above, the ultrasonic transducer device 200 includes the ultrasonic transducer element array 100 which has the $1^{st}$ to $k^{th}$ element groups (for example, EG1 to EG4 (k=4)), the first signal terminal (XAi) which is connected with the control section (for example, a processing apparatus 330 in FIG. 10) which performs at least one of receiving and transmitting of signals, and the second signal terminal (CAi) which is connected with the first signal terminal (XAi) via the ultrasonic transducer element array 100. The plurality of ultrasonic transducer elements (UEt1 to UEt3) which are included in each of the element groups EGt of the $1^{st}$ to $k^{th}$ element groups are electrically connected in series in each of the element groups EGt. The $1^{st}$ to $k^{th}$ element groups (EG1 to EG4) are electrically connected in parallel between the first signal terminal (XAi) and the second signal terminal (CAi).

By doing this, it is possible to improve reception sensitivity since it is possible to increase the amplitude of the reception voltage by connecting the ultrasonic transducer elements (UEt1 to UEt3) of each of the element groups EGt in series. In addition, it is possible to increase transmission sound pressure by connecting the element groups EG1 to EG4 in parallel between the terminals XAi and CAi. In this manner, it is possible to achieve both an increase in transmission sound pressure and improvement in reception sensitivity, and it is possible to receive slight echoes from the depths of a human body with a high S/N while suppressing the effects on the human body due to the transmission ultrasonic waves.

Here, the element groups refer to the plurality of ultrasonic transducer elements which are electrically connected between two nodes. The plurality of ultrasonic transducer elements may be connected in series, may be connected in parallel, or may be connected in a combination of in series and in parallel.

In addition, the plurality of ultrasonic transducer elements (UEt1 to UEt3) which are electrically connected in series are arranged to line up in the first direction which is the scanning direction DS in the present embodiment.

By doing this, as described in FIG. 4 and the like, it is possible to enhance the beam profile in the scanning direction DS. That is, it is possible to emit ultrasonic waves with the same phase and the same amplitude from the plurality of elements which are lined up along the scanning direction DS.

Here, "arranged to line up in the first direction" means, for example, arranged along the first direction. For example, in a case where the plurality of ultrasonic transducer elements are arranged to line up in the first direction, this is not limited to cases where the plurality of the ultrasonic transducer elements are lined up on a straight line along the first direction, and for example, the plurality of the ultrasonic transducer elements may be arranged in a zigzag with respect to a straight line along the first direction.

In addition, the $1^{st}$ to the $k^{th}$ element groups (EG1 to EG4) are arranged to line up in the second direction which intersects with (for example, is perpendicular to) the first direction in the present embodiment. For example, the second direction is the slice direction DL in the present embodiment.

By doing this, it is possible to configure one of the channels using $1^{st}$ to $k^{th}$ element groups (EG1 to EG4) which are arranged along the slice direction DL. Due to this, it is possible to perform a scanning operation by arranging a plurality of channels along the scanning direction and controlling transmitting and receiving using the plurality of channels.

In addition, the first signal electrode wiring (LSi) which is formed in the second direction and which is connected with the first signal terminal (XAi), and the second signal electrode wiring (LCi) which is formed in the second direction and which is connected with the second signal terminal (CAi) are included in the present embodiment. The $1^{st}$ to $k^{th}$ element groups (EG1 to EG4) are connected together (in common) between the second signal electrode wiring (LSi) and the second signal electrode wiring (LCi). For example, the second direction is the slice direction DL in the present embodiment.

By doing this, it is possible to arrange the element groups (EG1 to EG4) along the slice direction DL between the first signal electrode wiring (LSi) and the second signal electrode wiring (LCi) which are arranged along the slice direction DL.

Due to this, it is possible to arrange the element groups of one of the channels with good efficiency.

For example, the first signal electrode wiring (LSi) is formed to extend along the second direction (the slice direction DL) in the present embodiment. Here, extending means that conductive layers (wiring layers) are laminated on the substrate 60 using, for example, an MEMS process, a semiconductor process, or the like, and that at least two points are connected (for example, from the ultrasonic transducer elements up to the signal terminals) using the conductive layers.

In addition, in the present embodiment, two of the channels (for example, CH1 and CH2 in FIG. 2), which are configured to include the $1^{st}$ to $k^{th}$ element groups (EG1 to EG4), the first signal terminal (XAi), and the second signal terminal (CAi) which are arranged to line up in the second direction (the slice direction DL), are arranged to line up in the first direction which is the scanning direction DS. Then, the control section (for example, the processing apparatus 330 in FIG. 10) performs at least one of receiving and the transmitting of signals with respect to the first signal terminal (XAi) of each of the channels of the two channels.

By doing this, since the common terminal CAi is connected with each of the channels, it is possible to reduce the wiring resistance of the common electrode wiring LCi compared to a case where a common terminal which is shared is connected with a plurality of channels. Due to this, it is possible to suppress a delay or a decrease in the amplitude of the transmission signal due to the wiring resistance of the common electrode wiring LCi. In addition, by allocating the common terminal CAi for each of the channels, it is possible to suppress crosstalk between the channels via the common terminal CAi and the common electrode wiring LCi.

Here, in the embodiment described above, a case where one common electrode wiring is connected with one channel was described as an example, but the present embodiment is not limited to this, and one of the common electrode wirings may be shared by a plurality of channels.

5. Modified Example of Channel Element Group

Figure 6:
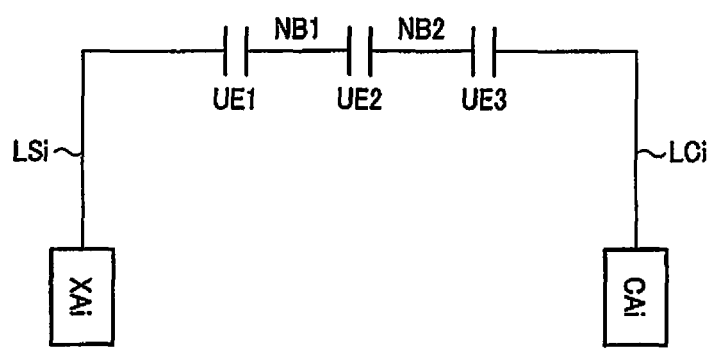
FIG. 6 is a modified example of a channel element group.

In the embodiment described above, a case where the channel element group CHi includes a plurality of element groups EG1 to EG4 was described as an example, but the present embodiment is not limited to this, and the channel element group CHi may include only one of the element groups. FIG. 6 illustrates a modified example of the channel element group Chi in this case.

The channel element group CHi shown in FIG. 6 includes ultrasonic transducer elements UE1 to UEj (for example, j=3) which are arranged along the scanning direction DS. The ultrasonic transducer elements UE1 to UE3 are connected in series between the signal electrode wiring LSi and the common electrode wiring LCi. In detail, UE1 is connected between the signal electrode wiring LSi and a node NB1, UE2 is connected between the node NB1 and a node NB2, and UE3 is connected between the node NB2 and the common electrode wiring LCi.

It is possible for the layout configuration to be configured in the same manner as the layout configuration of one of the element groups described in FIG. 4 or the like.

In the modified example described above, it is possible to realize an enhancement in the shape of the beam in the scanning direction DS as described in FIG. 4 and the like. That is, by arranging the plurality of ultrasonic transducer elements UE1 to UE3 which are connected in series along the scanning direction DS, it is possible to apply a transmission voltage with the same phase and the same amplitude between each of the terminals of the ultrasonic transducer elements in the scanning direction DS. Due to this, ultrasonic waves with the same phase and the same sound pressure are emitted from the ultrasonic transducer elements and it is possible to get close to the ideal shape of the beam in the scanning direction DS.

6. Head Unit

Figure 7:
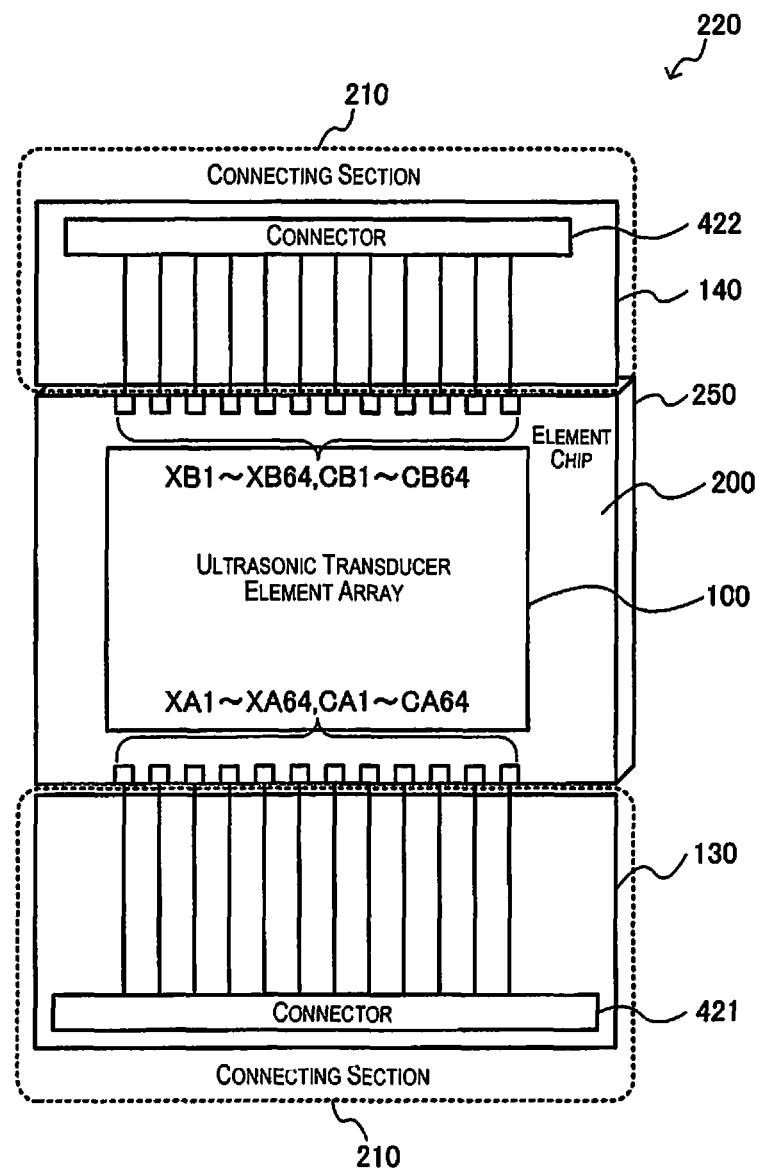
FIG. 7 is a configuration example of a head unit.

FIG. 7 illustrates a configuration example of a head unit 220 where the ultrasonic transducer device 200 of the present embodiment is mounted. The head unit 220 shown in FIG. 7 includes the ultrasonic transducer device 200 (also referred to below as an "element chip"), a connecting section 210, and a supporting member 250.

The element chip 200 includes the ultrasonic transducer element array 100, a first chip terminal group (the signal terminals XA1 to XA64 and the common terminals CA1 to CA64) which is provided on a first side of the element chip 200, and a second chip terminal group (the signal terminals XB1 to XB64 and common terminals CB1 to CB64) which is provided on the second side of the element chip 200. The element chip 200 is electrically connected with a processing apparatus (for example, the processing apparatus 330 in FIG. 10) of a probe body via the connecting section 210.

The connecting section 210 electrically connects the probe body and the head unit 220. The connecting section 210 has a first flexible substrate 130 which is provided on the first side of the element chip 200, a connector 421 which has a terminal group (a plurality of connecting terminals), a second flexible substrate 140 which is provided on the second side of the element chip 200, and a connector 422 which has a terminal group (a plurality of connecting terminals). A wiring group (a plurality of signal wirings and a plurality of common wirings) which connects the first chip terminal group and the terminal group of the connector 421 is formed on the flexible substrate 130. A wiring group (a plurality of signal wirings and a plurality of common wirings) which connects the second chip terminal group and the terminal group of the connector 422 is formed on the flexible substrate 140.

As above, it is possible to electrically connect the probe body and the head unit 220 by providing the connecting section 210 and it is also possible for the head unit 220 to be attached to and detached from the probe body.

Here, for the transmission signal which is applied to the signal terminal (XAi in FIG. 2 and FIG. 3) of the element chip 200, the phase is delayed and the amplitude is decreased according to the separation from the signal terminals in the channels due to the effects of the capacitive components of the elements and the wiring resistance of the electrode wiring. As a result, when the transmission signal is applied only from one end of the channel, deviation is generated in the beam profile of the ultrasonic waves in the slice direction DL. In this point, it is possible to input the transmission signal from both ends (the signal terminals XAi and XBi in FIG. 2 and FIG. 3) of the channel by providing the first and second flexible substrates 130 and 140 in the present embodiment. Due to this, it is possible to suppress deviation in the beam profile in the slice direction DL.

FIG. 8A to FIG. 8C illustrate a detailed configuration example of the head unit 220. FIG. 8A illustrates a second surface SF2 side of the supporting member 250, FIG. 8B illustrates a first surface SF1 side of the supporting member 250, and FIG. 8C illustrates a side surface side of the supporting member 250.

The supporting member 250 is a member which supports the element chip 200. The connectors 421 and 422 are provided on the first surface SF1 side of the supporting member 250. It is possible for the connectors 421 and 422 to be attached to and detached from connectors which correspond to the probe body side. The element chip 200 is supported on the second surface SF2 side which is the rear surface of the first surface SF1 of the supporting member 250. Fixing members 260 are provided at each corner section of the supporting member 250 and are used to fix the head unit 220 to a probe casing.

Here, the first surface SF1 side of the supporting member 250 is a normal direction side of the first surface SF1 of the supporting member 250, and the second surface SF2 side of the supporting member 250 is a normal direction side of the second surface SF2 which is the rear surface of the first surface SF1 of the supporting member 250.

As shown in FIG. 8C, a protective member 270 (a protecting film) which protects the element chip 200 is provided on the surface (the surface where the piezoelectric body layer 30 is formed in FIG. 1B) of the element chip 200. The protective member 270 may also be used as an acoustic adjustment layer, an acoustic lens, or the like.

7. Ultrasonic Probe

FIG. 9A and FIG. 9B illustrate a configuration example of an ultrasonic probe 300 (a probe) where the head unit 220 described above is applied. FIG. 9A illustrates a case where a probe head 310 is mounted in a probe body 320 and FIG. 9B illustrates a case where the probe head 310 is separated from the probe body 320.

The probe head 310 includes the head unit 220 and a probe casing 240 which contains a contact member 230, which comes into contact with a subject, and the head unit 220. The element chip 200 is provided between the contact member 230 and the supporting member 250.

The probe body 320 includes the processing apparatus 330 and a probe body side connector 426. The processing apparatus 330 includes a transmission section 332, a reception section 335 (an analog front end section), and the transmission and reception control section 334. The transmission section 332 performs a process of transmitting a driving pulse (a transmission signal) to the element chip 200. The reception section 335 performs a process of receiving an ultrasonic echo signal (a reception signal) from the element chip 200. The transmission and reception control section 334 performs control of the transmission section 332 and the reception section 335. The probe body side connector 426 connects with a head unit side connector 425 (or a probe head side connector). The probe body 320 connects with an electronic device (for example, an ultrasonic imaging apparatus) body using a cable 350.

The head unit 220 is contained in the probe casing 240, but it is possible to remove the head unit 220 from the probe casing 240. By doing this, it is possible to replace only the head unit 220. Alternatively, it is possible to replace the head unit 220 in a state of being contained in the probe casing 240, that is, as the probe head 310.

8. Ultrasonic Imaging Apparatus

Figure 10:
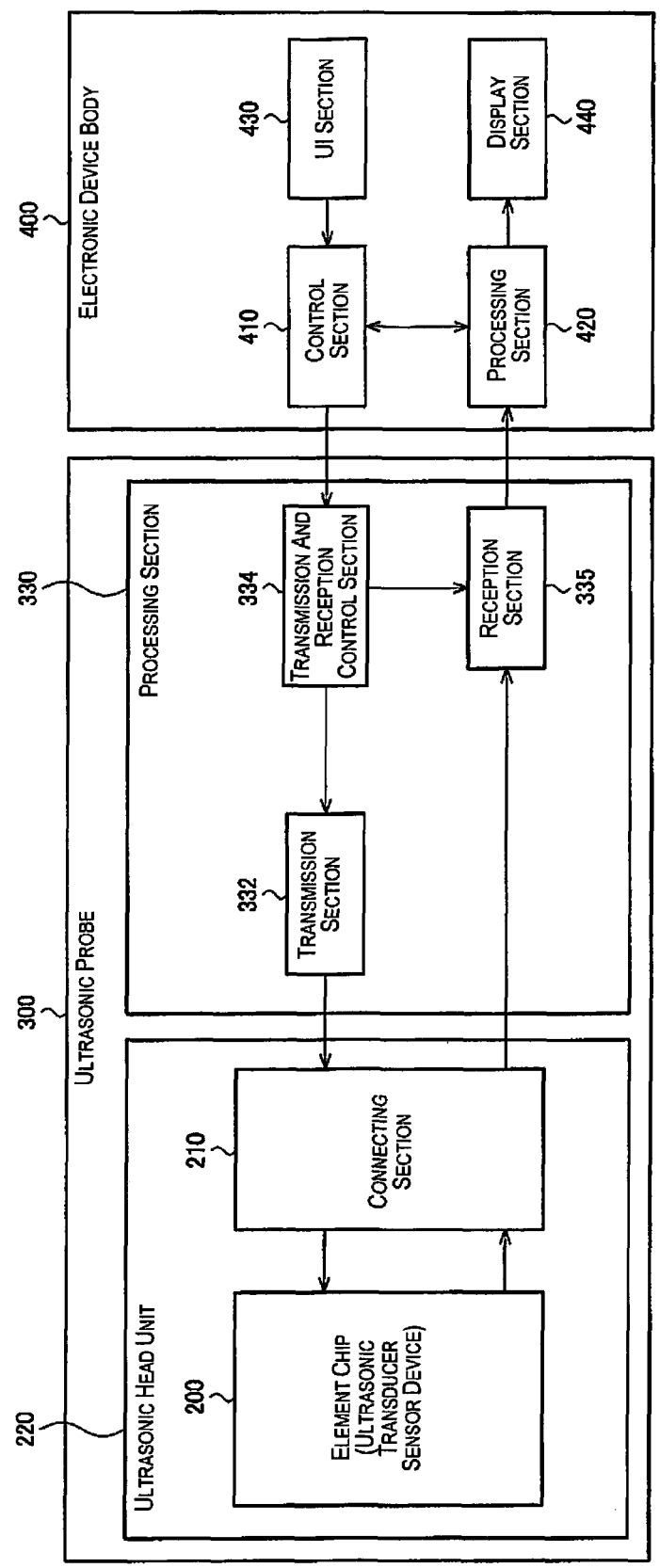
FIG. 10 is a configuration example of an ultrasonic imaging apparatus.

FIG. 10 illustrates a configuration example of an ultrasonic imaging apparatus. The ultrasonic imaging apparatus includes the ultrasonic probe 300 and an electronic device body 400. The ultrasonic probe 300 includes the head unit 220 (an ultrasonic head unit) and the processing apparatus 330. The electronic device body 400 includes a control section 410, a processing section 420, a user interface section 430, and a display section 440.

The processing apparatus 330 includes the transmission section 332, the transmission and reception control section 334, and the reception section 335 (an analog front end section). The head unit 220 includes the element chip 200 and the connecting section 210 (a connector section) which connects the element chip 200 with a circuit substrate (for example, a rigid substrate). The transmission section 332, the transmission and reception control section 334, and the reception section 335 are mounted onto the circuit substrate. The transmission section 332 may include a high voltage generating circuit (for example, a booster circuit) which generates a power supply voltage of a pulsar.

In a case where ultrasonic waves are transmitted, the transmission and reception control section 334 performs a transmission instruction with respect to the transmission section 332, and the transmission section 332 receives the transmission instruction and outputs a driving voltage by amplifying a driving signal to a high voltage. In a case where reflected ultrasonic waves are received, the reception section 335 receives a reflected wave signal which is detected using the element chip 200. The reception section 335 processes the reflected wave signal (for example, an amplification process, an A/D conversion process, or the like) based on a reception instruction from the transmission and reception control section 334 and the signal after processing is transmitted to the processing section 420. The processing section 420 displays the signal on the display section 440 as an image.

Here, it is possible for the ultrasonic transducer device of the present embodiment to be applied to various electronic devices without being limited to the ultrasonic imaging apparatus for medical use as described above. For example, a diagnosis device for checking the insides of buildings and the like without damage, a user interface device which detects movement of a finger of a user using reflection of ultrasonic waves, and the like can be assumed as the electronic devices where the ultrasonic transducer device is applied.

Here, the present embodiment is described in detail as above, but it should be possible for a person skilled in the art to easily conceive that many changes are possible without substantially departing from the novel items and effects of the present invention. In accordance with this, all of the modified examples are included in the scope of the present invention. For example, in the specifications and diagrams, it is possible for terms, which are described along with different terms which have a broader or similar meaning, to be replaced at least once with the different terms in any locations in any of the specifications or diagrams. In addition, all combinations of the present embodiment and modified examples are also included in the scope of the present invention. In addition, various modifications are possible with respect to the configuration and operation of the ultrasonic transducer device, the probe, and the ultrasonic imaging apparatus, and the like without being limited to what is described in the present embodiment.

GENERAL INTERPRETATION OF TERMS

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Finally, terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents.

What is claimed is:

1. An ultrasonic transducer device comprising:
   a substrate;
   an ultrasonic transducer element array disposed on the substrate, the ultrasonic transducer element array having a $1^{st}$ element group to a $k^{th}$ element group, where k is a natural number such that k≥2;
   a first signal terminal connected with a control section configured to perform at least one of receiving and transmitting of signals; and
   a second signal terminal connected with the first signal terminal via the ultrasonic transducer element array,
   wherein the $1^{st}$ element group to the $k^{th}$ element group each include a plurality of ultrasonic transducer elements electrically connected in series,
   the $1^{st}$ element group to the $k^{th}$ element group are electrically connected in parallel between the first signal terminal and the second signal terminal,
   the ultrasonic transducer elements electrically connected in series are disposed over the substrate such that the ultrasonic transducer elements electrically connected in series are arranged to line up along a first direction along a surface of the substrate which is perpendicular to a normal direction of the surface of the substrate,
   each of the ultrasonic transducer elements has a first electrode, a second electrode, and a transducer section disposed between the first electrode and the second electrode in the normal direction of the substrate, with the first electrode, the transducer section and the second electrode being layered with respect to each other in the normal direction of the substrate, and
   the first electrode of one of an adjacent pair of the ultrasonic transducer elements is formed in a looped shape, and is overlapped with the second electrode of the other one of the adjacent pair of the ultrasonic transducer elements to electrically connect the adjacent pair of the ultrasonic transducer elements relative to each other in series in the first direction which is a scanning direction.

2. The ultrasonic transducer device according to claim 1, wherein
   the first signal terminal is connected with the control section configured to perform receiving and transmitting of signals.

3. The ultrasonic transducer device according to claim 1, wherein
   the $1^{st}$ element group to the $k^{th}$ element group are arranged to line up along a second direction which intersects with the first direction.

4. The ultrasonic transducer device according to claim 1, wherein
   each of the $1^{st}$ element group to the $k^{th}$ element group has a $1^{st}$ ultrasonic transducer element to a $j^{th}$ ultrasonic transducer element, where j is a natural number such that j≥2, as the ultrasonic transducer elements,
   the first electrode of the $1^{st}$ ultrasonic transducer element is connected with the first signal terminal, and the second electrode of the $1^{st}$ ultrasonic transducer element is connected with the first electrode of a $2^{nd}$ ultrasonic transducer element among the $1^{st}$ ultrasonic transducer element to the $j^{th}$ ultrasonic transducer element.

5. The ultrasonic transducer device according to claim 4, wherein
the second electrode of a $j-1^{th}$ ultrasonic transducer element among the $1^{st}$ ultrasonic transducer element to the $j^{th}$ ultrasonic transducer element is connected with the first electrode of the $j^{th}$ ultrasonic transducer element, and
the second electrode of the $j^{th}$ ultrasonic transducer element is connected with the second signal terminal.

6. The ultrasonic transducer device according to claim 1, further comprising:
a first signal electrode wiring extending in a second direction which intersects with the first direction and connected with the first signal terminal; and
a second signal electrode wiring extending in the second direction and connected with the second signal terminal,
wherein the $1^{st}$ element group to the $k^{th}$ element group are connected in common between the first signal electrode wiring and the second signal electrode wiring.

7. The ultrasonic transducer device according to claim 3, wherein
two channels are arranged to line up along the first direction, which is the scanning direction, with each of the channels including the $1^{st}$ element group to the $k^{th}$ element group arranged to line up along a second direction intersecting with the first direction, the first signal terminal, and the second signal terminal, and
the control section is configured to perform at least one of receiving and transmitting of signals with respect to the first signal terminal of each of the channels.

8. An ultrasonic transducer device comprising:
a substrate;
an ultrasonic transducer element array disposed on the substrate;
a first signal terminal connected with a control section configured to perform at least one of receiving and transmitting of signals; and
a second signal terminal connected with the first signal terminal via the ultrasonic transducer element array,
wherein the ultrasonic transducer element array has at least one element group each including a plurality of ultrasonic transducer elements electrically connected in series,
the ultrasonic transducer elements electrically connected in series are disposed over the substrate such that the ultrasonic transducer elements electrically connected in series are arranged to line up along a first direction along a surface of the substrate which is perpendicular to a normal direction of the surface of the substrate,
each of the ultrasonic transducer elements has a first electrode, a second electrode, and a transducer section disposed between the first electrode and the second electrode in the normal direction of the substrate, with the first electrode, the transducer section and the second electrode being layered with respect to each other in the normal direction of the substrate, and
the first electrode of one of an adjacent pair of the ultrasonic transducer elements is formed in a looped shape, and is overlapped with the second electrode of the other one of the adjacent pair of the ultrasonic transducer elements to electrically connect the adjacent pair of the ultrasonic transducer elements relative to each other in series in the first direction which is a scanning direction.

9. An ultrasonic transducer device comprising:
a substrate;
a first element group including a plurality of ultrasonic transducer elements electrically connected in series, the ultrasonic transducer elements electrically connected in series being disposed over the substrate such that the ultrasonic transducer elements electrically connected in series are arranged to line up along a first direction along a surface of the substrate which is perpendicular to a normal direction of the surface of the substrate;
a second element group including a plurality of ultrasonic transducer elements electrically connected in series, the ultrasonic transducer elements electrically connected in series being disposed over the substrate such that the ultrasonic transducer elements electrically connected in series are arranged to line up along the first direction of the surface of the substrate; and
a connecting wiring electrically connecting the first element group and the second element group in parallel,
wherein each of the ultrasonic transducer elements has a first electrode, a second electrode, and a transducer section disposed between the first electrode and the second electrode in the normal direction of the substrate, with the first electrode, the transducer section and the second electrode being layered with respect to each other in the normal direction of the substrate, and
the first electrode of one of an adjacent pair of the ultrasonic transducer elements is formed in a looped shape, and is overlapped with the second electrode of the other one of the adjacent pair of the ultrasonic transducer elements to electrically connect the adjacent pair of the ultrasonic transducer elements relative to each other in series in the first direction which is a scanning direction.

10. A head unit of a probe comprising:
the ultrasonic transducer device according to claim 1,
wherein the ultrasonic transducer device is configured and arranged to be attached and detached with respect to a probe body of the probe.

11. The head unit according to claim 10, further comprising:
a first flexible substrate having a wiring group disposed at one end of the ultrasonic transducer device and connected with one of the first signal terminal and the second signal terminal arranged at the one end of the ultrasonic transducer device.

12. The head unit according to claim 11, further comprising:
a second flexible substrate having a wiring group disposed at the other end of the ultrasonic transducer device and connected with the other one of the first signal terminal and the second signal terminal arranged at the other end of the ultrasonic transducer device.

13. A probe comprising:
the ultrasonic transducer device according to claim 1; and
a probe body.

14. An ultrasonic imaging apparatus comprising:
the probe according to claim 13; and
a display section configured and arranged to display image data.

* * * * *